United States Patent
Dodson et al.

(10) Patent No.: US 8,867,304 B2
(45) Date of Patent: *Oct. 21, 2014

(54) COMMAND THROTTLING FOR MULTI-CHANNEL DUTY-CYCLE BASED MEMORY POWER MANAGEMENT

(71) Applicant: International Business Machines Corporation, Armonk, NY (US)

(72) Inventors: John Dodson, Austin, TX (US); Karthick Rajamani, Austin, TX (US); Eric Retter, Austin, TX (US); Kenneth Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/911,566

(22) Filed: Jun. 6, 2013

(65) Prior Publication Data
US 2013/0304997 A1  Nov. 14, 2013

Related U.S. Application Data

(63) Continuation of application No. 13/314,379, filed on Dec. 8, 2011, now Pat. No. 8,675,444.

(51) Int. Cl.
  *G11C 8/00* (2006.01)
  *G06F 3/06* (2006.01)
  *G06F 13/16* (2006.01)
  *G06F 1/32* (2006.01)

(52) U.S. Cl.
  CPC ............. *G06F 3/0644* (2013.01); *G06F 13/16* (2013.01); *G06F 1/32* (2013.01)
  USPC ......... 365/233.1; 365/226; 711/105; 710/112

(58) Field of Classification Search
  CPC .......... G06F 3/0644; G06F 13/16; G06F 1/32
  USPC ................. 365/226, 233.1; 711/105; 710/112
  See application file for complete search history.

(56) References Cited

U.S. PATENT DOCUMENTS 6,330,639 B1  12/2001  Fanning et al.
6,662,278 B1  12/2003  Kahn et al.
(Continued)

OTHER PUBLICATIONS

Floyd et al., "System power management support in the IBM POWER6 microprocessor," IBM Journal of Research and Development, vol. 51; NUMB 6, pp. 733-746 (Nov. 2007).

(Continued)

*Primary Examiner* — Fernando Hidalgo
(74) *Attorney, Agent, or Firm* — Yudell Isidore PLLC; Tom Tyson

(57) ABSTRACT

A technique for memory command throttling in a partitioned memory subsystem includes accepting, by a master memory controller included in multiple memory controllers, a synchronization command. The synchronization command includes command data that includes an associated synchronization indication (e.g., synchronization bit(s)) for each of the multiple memory controllers and each of the multiple memory controllers controls a respective partition of the partitioned memory subsystem. In response to receiving the synchronization command, the master memory controller forwards the synchronization command to the multiple memory controllers. In response to receiving the forwarded synchronization command each of the multiple memory controllers de-asserts an associated status bit. In response to receiving the forwarded synchronization command, each of the multiple memory controllers determines whether the associated synchronization indication is asserted. Each of the multiple memory controllers with the asserted associated synchronization indication then transmits the forwarded synchronization command to associated power control logic.

7 Claims, 8 Drawing Sheets

(56) References Cited

U.S. PATENT DOCUMENTS

| | | | |
|---|---|---|---|
| 7,155,623 | B2 | 12/2006 | Lefurgy et al. |
| 7,496,777 | B2 | 2/2009 | Kapil |
| 7,562,178 | B2 | 7/2009 | Jeddeloh |
| 7,681,057 | B2 | 3/2010 | Payne |
| 7,945,719 | B2 * | 5/2011 | Hunsaker et al. ............. 710/112 |
| 8,234,441 | B2 * | 7/2012 | Uchiyama et al. ............ 711/105 |
| 2006/0236043 | A1 | 10/2006 | Ogura et al. |
| 2006/0248355 | A1 | 11/2006 | Thayer |
| 2011/0055443 | A1 * | 3/2011 | Watanabe et al. ............. 710/240 |

OTHER PUBLICATIONS

Ware et al., "Architecting for power management: The IBM® POWER7™ approach," High Performance Computer Architecture (HPCA), 2010 IEEE 16th International Symposium on High Performance Computer Architecture, pp. 1-11 (Jan. 9, 2010).

Zheng et al., "Mini-Rank: Adaptive DRAM Architecture for Improving Memory Power Efficiency," MICRO, pp. 210-221 (2008).

Hanson et al., "What Computer Architects Need to Know About Memory Throttling," WEED 2010—Workshop on Energy-Efficient Design, pp. 44-49 (2010).

U.S. Appl. No. 13/314,379 entitled "Synchronized Command Throttling for Multi-Channel Duty-Cycle Based Memory Power Management"; Notice of Allowance dated Oct. 29, 2013 (14 pg).

UK Intellectual Property Office, UK application GB1221061.3, GB Search Report dated May 9, 2013 (2 pg).

* cited by examiner ated with energy and cooling. Reduced power consumption leads to reduced heat dissipation (which increases system stability) and less energy use (which saves money and reduces environmental impact). Power management for processors can be implemented over an entire processor or in specific processor areas. For example, dynamic voltage scaling and dynamic frequency scaling may be employed to reduce a processor core voltage and clock rate, respectively, to lower processor power consumption, albeit at lower processor performance.

COMMAND THROTTLING FOR MULTI-CHANNEL DUTY-CYCLE BASED MEMORY POWER MANAGEMENT

This application is a continuation of U.S. patent application Ser. No. 13/314,379, entitled "Synchronized Command Throttling for Multi-Channel Duty-Cycle Based Memory Power Management," filed on Dec. 8, 2011, the disclosure of which is incorporated herein by reference in its entirety for all purposes.

BACKGROUND

1. Field

This disclosure relates generally to memory power management and, more specifically, to synchronized command throttling for multi-channel duty-cycle based memory power management.

2. Related Art

Power management has been implemented as a feature of some electrical devices (e.g., copiers, computer systems, and computer system peripherals, such as monitors and printers) to turn-off device power or switch the device to a low-power state when the device is inactive. In computing, personal computer (PC) power management has been built around the advanced configuration and power interface (ACPI) standard. The ACPI standard provides for unified operating system (OS) device configuration and power management and defines platform independent interfaces for hardware discovery, configuration, power management, and monitoring.

In general, computer system power management is desirable to: reduce overall energy consumption; prolong battery life for portable and embedded systems; reduce cooling requirements; reduce noise; and reduce operating costs associated with energy and cooling. Reduced power consumption leads to reduced heat dissipation (which increases system stability) and less energy use (which saves money and reduces environmental impact). Power management for processors can be implemented over an entire processor or in specific processor areas. For example, dynamic voltage scaling and dynamic frequency scaling may be employed to reduce a processor core voltage and clock rate, respectively, to lower processor power consumption, albeit at lower processor performance.

In addition to lower power consumption, power management techniques are also used to dynamically allocate power usage to various components within a system while staying with an overall system power envelope. For example, if dynamic random access memory (DRAM) power can be temporarily limited to some value lower that its normal maximum, the saved power can then be allocated to processor cores to increase voltage and clock rate, and, as a result, performance can be increased during periods of high processor utilization. Conversely, during periods of relatively low processor core utilization and high DRAM utilization, core power can be temporarily limited and saved power can be allocated to DRAM to allow for additional memory bandwidth.

Advances in semiconductor process technology have allowed microprocessor designers to increasingly locate more processor cores on each integrated circuit (chip), while staying within a given power envelope. In addition to processor cores, other functions have been incorporated in various chips to provide system-on-a-chip (SOC) architectures. However, process scaling due to advances in semiconductor process technology has not been uniform across all device types. For example, DRAM has not scaled (in capacity or speed) as quickly as processors, due to advances in semiconductor process technology. As a result, DRAM has generally become the single largest power consumer in fully-configured enterprise class computing systems. In general, as the number of processor cores is increased, the demand for additional memory capacity and memory bandwidth increases. However, as noted above, increasing DRAM increases the need for additional system power delivery and power dissipation capability.

SUMMARY

According to one aspect of the present disclosure, a technique for memory command throttling in a partitioned memory subsystem includes accepting, by a master memory controller included in multiple memory controllers, a synchronization command. The synchronization command includes command data that includes an associated synchronization indication (e.g., a synchronization bit or bits) for each of the multiple memory controllers and each of the multiple memory controllers controls a respective partition of the partitioned memory subsystem. In response to receiving the synchronization command, the master memory controller forwards the synchronization command to the multiple memory controllers. In response to receiving the forwarded synchronization command each of the multiple memory controllers de-asserts an associated status bit. In response to receiving the forwarded synchronization command, each of the multiple memory controllers determines whether the associated synchronization indication is asserted. Each of the multiple memory controllers with the asserted associated synchronization indication then transmits the forwarded synchronization command to associated power control logic.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
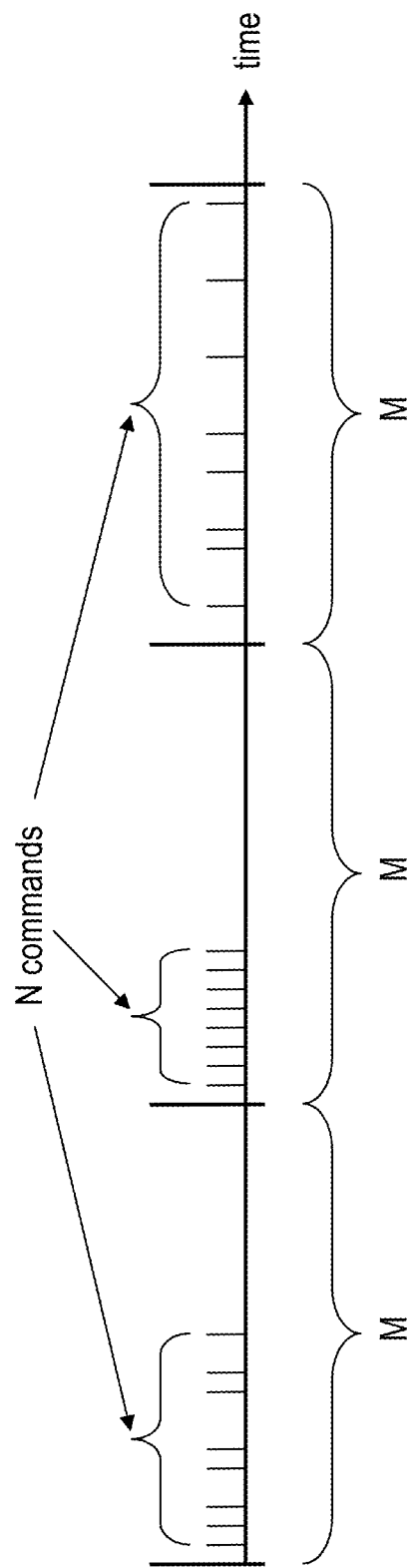
FIG. 1 is a diagram of a memory command throttling approach (referred to herein as 'N/M power control') where a memory controller is limited to issuing a programmed number of memory commands 'N' within a programmed time window 'M', according to various aspects of the present disclosure.

As will be appreciated by one of ordinary skill in the art, aspects of the present invention may be embodied as a system, method or computer program product. Accordingly, aspects of the present invention may take the form of a hardware embodiment or an embodiment combining software (including firmware, resident software, micro-code, etc.) and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples of the computer readable storage medium include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

To mitigate the additional power demands when dynamic random access memory (DRAM) is increased in a system, a broad array of conventional memory power management approaches have been developed. While the discussion herein focuses on DRAM, it is contemplated that the techniques disclosed herein may find application with respect to other memory types. In general, memory power management approaches have attempted to dynamically balance memory power with bandwidth (performance) demands. Memory power management approaches for a multi-processor system are usually implemented in software that executes on a central processing unit (CPU) core (processor core or processor) within the multi-processor system or on a dedicated embedded co-processor within the multi-processor system. In an attempt to maintain a lowest overall memory power consumption for an associated multi-processor system, software implemented memory power management approaches have usually monitored changes in workload demand and dynamically limited read/write traffic to DRAM in reaction to the changes in workload demand.

One conventional approach for limiting memory power consumption has employed memory command throttling. In one memory command throttling approach, a memory controller (MC) causes successive memory commands to be spaced apart some minimum amount of time. In another memory command throttling approach (referred to herein as 'N/M power control'), a memory controller has issued a programmed number of memory commands 'N' within a programmed time window 'M'. The programmed time window 'M' has usually been established by a counter, whose initial value is loaded from a programmable register.

With reference to FIG. 1, eight (i.e., 'N' is 8) memory commands are allowed to be issued during each programmed time window 'M' (e.g., 'M' is the time for issuing 100 memory commands). An advantage of limiting the issuance of 'N' memory commands during each programmed time window 'M' is that high-bandwidth bursts of traffic may be issued over a relatively short period of time while still limiting an overall bandwidth/power. Employing power management code to control the values of 'N' and 'M' provides a convenient mechanism that may be used to effectively achieve a dynamically controllable power/performance duty-cycle.

In server class microprocessor designs, a memory subsystem may be partitioned into multiple memory channels, with each of the memory channels having a dedicated MC. Partitioning a memory subsystem into multiple memory channels usually eases connectivity congestion by allowing memory connections to be physically spread out within the memory subsystem. In some partitioned memory subsystems, memory channels run independently of each other and a cache block is accessed via a single channel. Allowing memory channels of a partitioned memory subsystems to run independently of each other generally increases modularity and reduces design complexity. In other partitioned memory subsystems, channels (or groups of channels) may run in lock-step with one another such that a cache block memory access is allocated across two or more channels.

Figure 2:
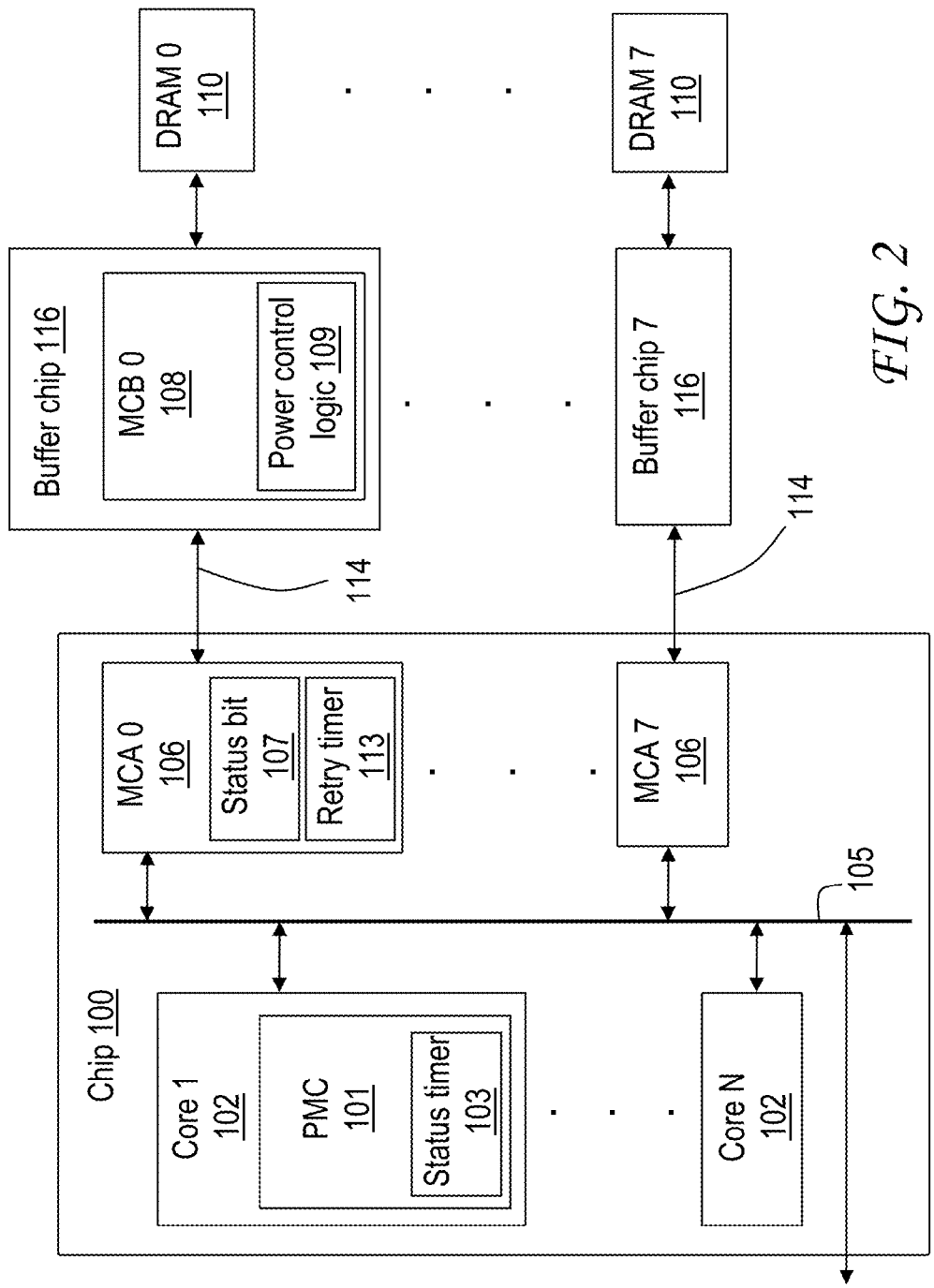
FIG. 2 is a diagram of a relevant portion of an exemplary system-on-a-chip (SOC) multi-core architecture, according to various embodiments of the present disclosure.

With reference to FIG. 2, an exemplary multi-core architecture is depicted that includes a memory subsystem (including DRAM 0 through DRAM 7) that employs multiple memory channels, each of which has an independent memory controller (MC) 106/108. As is shown, chip 100 includes multiple processors cores 102, each of which are coupled to a coherent fabric interconnect 105. In this embodiment, one of cores 102 executes power management code (PMC) 101, which implements a status timer 103 that is used by PMC 101 to determine when a status bit 107 (implemented by MC 106) should be read. Cores 102 may, for example, operate in a simultaneous multithreading (SMT) mode or a single thread (ST) mode.

In FIG. 2, each respective MC 106/108 is split into two portions (i.e., an 'A' portion and a 'B' portion), which communicate via respective high-speed links 114. As is illustrated, the 'A' portion resides in MC 106 (labeled 'MCA 1' through 'MCA 7') on chip 100 and interfaces with coherent fabric interconnect 105 and the 'B' portion (labeled 'MCB 1' through 'MCB 7') resides on an external memory buffer chip 116 and interfaces with the 'A' portion and a respective DRAM 110. In one or more embodiments, the memory command throttling function is implemented in buffer chip 116. Alternatively, an entire memory control function may be implemented in chip 100 and in this case buffer chips 116 are not employed. While eight MCs 106/108 are shown as being implemented in FIG. 2, it should be appreciated that more or less than eight MCs 106/108 may be implemented in a multi-core architecture configured according to the present disclosure.

In order to spread the memory bandwidth load across multiple memory channels, address interleaving is routinely employed. In approaches that employ address interleaving, multiple memory channels are assigned to interleave groups. For example, when two memory channels are grouped together in an interleave group, a first memory channel may decode even cache block addresses and a second memory channel may decode odd cache block addresses. In implementations that employ address interleaving, each interleaved group of memory channels represents a contiguous block of system memory.

While interleaving memory channels usually provides for better memory bandwidth within a given region of memory, interleaving memory channels requires that power management code 101 control memory power within a contiguous region of memory that is controlled by multiple independent MCs that are independently scheduling (and potentially throttling) memory commands. In the event that respective throttling windows of MCs 106/108 within an interleave group are out-of-phase, memory access stalls may occur at different points in time. Unfortunately, memory access stalls that occur at different points in time may adversely impact application performance and prevent power management code 101 from being able to adequately control a power/performance duty-cycle.

In an N/M power control approach when 'N' memory accesses have been performed since the start of the current accounting interval, all subsequent accesses have to wait until 'M' time units have elapsed since the interval began. In this case, requests are held back/throttled based on how many requests have been serviced since the interval began and how much time is left until the end of the interval on a throttled MC. If the intervals are not synchronized across MCs within an interleave group, the MCs in the interleave group may stall requests at different points in time.

For example, a workload whose access stream naturally spans multiple MCs will be held back by each MC in its progress at different points in time potentially paying twice the penalty for its requests exceeding the allowed N/M rate. This can happen because of dependency in the stream spanning both MCs in the code or because of shared resources in the system (queues, etc.) that service requests to the multiple MCs. In general, the impact can be broader than an interleave group, but the impact is most exemplified within an interleave group because of spatial locality of accesses.

As an example, assume two MCs in the same interleave group, i.e., the MCs each service alternate cache line requests in their address range, and a consecutive stream of 800 cache line requests, where data in the odd MC (MC1) and even MC (MC0) cache lines are to be operated on together in some fashion. Assume 'N' is 100 and 'M' is the time required for 200 requests. The expectation with two MCs is that 800 requests would be serviced in 4M units of time or that 200 requests would be serviced in 1M unit of time. Assume the interval starts on the two MCs are out of phase by fifty percent, e.g., an interval begins at T=0 on MC0 and T=0.5M on MC1. When T=0.5M, MC0 stops servicing requests and MC1 begins a new interval and can service requests until T=1M. When T=1M, MC0 can begin servicing requests, but MC1 is stopped. Even without any dependency in an application, requests to MC0 would stop as requests to MC1 would hold up MC0 until T=1.5M, when MC1 begins a new interval. In this case, only around 200 requests would be serviced in 1.5M by the two MCs, as contrasted with the desired rate of 200 requests (100 each) in 1 M.

According to the present disclosure, techniques are disclosed that allow power management code 101 to deterministically control memory power versus bandwidth demand across multiple interleaved memory channels in a synchronized manner. In various embodiments, memory channel power throttling behavior is synchronized between memory channels in an interleaved group. According to the present disclosure, power management code 101 implements an N/M power control feature that facilitates alignment of a start of a throttling window 'M' in each memory controller within an interleaved group in a synchronized manner. By combining control of throttling window 'M' start synchronization and control of throttling window width, power management code 101 may optimally control a power/bandwidth duty-cycle of a memory subsystem.

Figure 4:
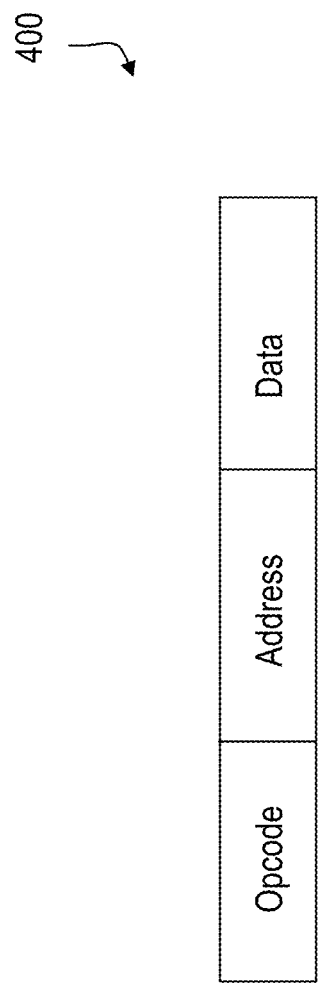
FIG. 4 is a diagram of an exemplary N/M synchronization command according to aspects of the present disclosure.

As used herein, an N/M synchronization (N/M_sync) command is a command that is broadcast (by power management code 101) on coherent fabric interconnect 105. With reference to FIG. 4, in one or more embodiments, N/M_sync command 400 takes the form of a cache-inhibited store operation (specified by an operational code (opcode)) to a specified address or as a dedicated unique command type. In one or more embodiments, all MCs 106 on chip 100 snoop coherent fabric interconnect 105. However, only one MC 106 is configured as a master MC for N/M_sync commands. The master MC accepts the N/M_sync command on behalf of all MCs 106 on chip 100. In various embodiments, any MC 106 can be configured as the master MC. However, only one MC 106 at a time is selected as the master MC. In one or more embodiments, the master MC is selected (e.g., through accessing a configuration file) at boot-up and is not changed following boot-up.

In various embodiments, command data that accompanies the N/M_sync command includes one bit per MC 106 that indicates which MCs 106 should forward the N/M_sync command to their respective power control logic 109 (included in MCs 108). The command data allows power management code 101 to specify which MCs 106 (e.g., those within an interleave group) are to perform a synchronization operation. Even if the master MC is not part of the group that is the target of the N/M_sync command (i.e., the bit of the master MC is not asserted in the command data), the master MC is still responsible for forwarding the command to other MCs 106.

Figure 3:
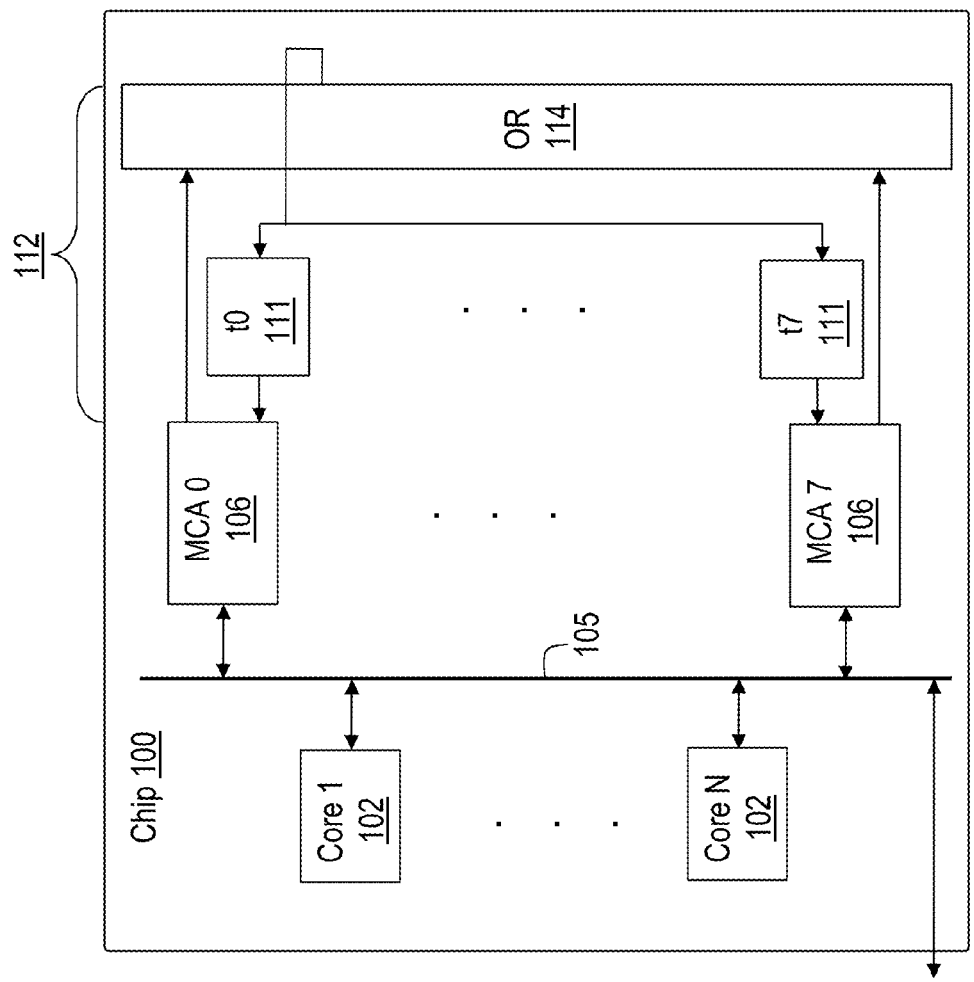
FIG. 3 is a diagram of a relevant portion of the exemplary SOC multi-core architecture of FIG. 2 according to another aspect of the present disclosure.

With reference to FIG. 3, in one or more embodiments, a single-wire serial-interface 112 is utilized by the master MC to send an N/M_sync command to all MCs 106 (including the master MC). In general, interface 112 includes one output and one input for each MC 106. In one or more embodiments, all MCs 106 have an output, as any MC 106 may be configured as the master MC. In various embodiments, the outputs from all MCs 106 are logically ORed together (using an OR gate 114). An output of OR gate 114 is routed back to all MCs 106 via respective delay blocks 111 (labeled 't0' through 't7'). Delay blocks 111 are implemented because MCs 106 may be physically located in different areas of chip 100 and it may take a different number of clock cycles to propagate a serial bit stream of the N/M_sync command from the master MC to all MCs 106. Delay blocks 111 are tuned (e.g., during design) to account for different propagation delays such that an N/M_sync command arrives at all MCs 106 in a same clock cycle.

Upon receiving the N/M_sync command, MCs 106 are configured to determine if an associated bit is asserted within the command data. If an associated bit is asserted in the command data, an MC 106 forwards the N/M_sync command on to power control logic 109. In at least one embodiment, to ensure that the N/M_sync command is sent on all channels within a group at the same time, the N/M_sync command is defined to have a highest transmission priority (on high-speed link 114), for communications between MCs 106 and MCs 108.

Since an inherent bit error rate on high-speed links 114 typically requires employment of a cyclic redundancy code (CRC) and a retry protocol, it is possible that a retry sequence could delay an N/M_sync command from reaching a buffer chip 116 at the same time as other channels in the group that did not experience a retry. When a retry sequence delays an N/M_sync command from reaching a buffer chip 116 at the same time as other channels in a group that did not experience a retry, overall window 'M' start synchronization fails. To guard against synchronization failure of the overall window 'M' start synchronization, each MC 106 may implement a programmable retry timer 113 that is started when the N/M_sync command is sent on high-speed link 114.

If no CRC retry sequence is required while retry timer 113 is active, a status bit 107 is asserted to indicate that the N/M_sync command arrived at the destination (power control logic 109 on buffer chip 116) without error. When a CRC retry occurs while retry timer 113 is active, power control logic 109 within buffer chip 116 may not have received the N/M_sync command in a deterministic time. In this case, the multi-channel synchronization failed and the N/M_sync command needs to be re-issued by power management code 101.

In one or more embodiments, power management code 101 may incorporate a wait loop (using status timer 103) of a duration longer than retry timer 113, such that when retry timer 113 expires, power management code 101 can be assured that all MCs 106 in a targeted interleave group have adequate time to update a respective "sync complete without error" status bit (i.e., status bit 107). Power management code 101 may then issue a 'sync status read command' to each MC 106 in the selected group. If any of status bits 107 that should be asserted are not asserted, a CRC retry occurred during the issuance of the N/M_sync command for that channel and power management code 101 needs to re-issue the N/M_sync command.

Each status bit 107 is reset by a next N/M_sync command so that each status bit 107 always holds the status of the last N/M_sync command issued. When power control logic 109 in MC 108 of buffer chip 116 receives the N/M_sync command, power control logic 109 resets its 'M' timer (to start a new throttling window) and also resets its 'N' command count.

Figure 5:
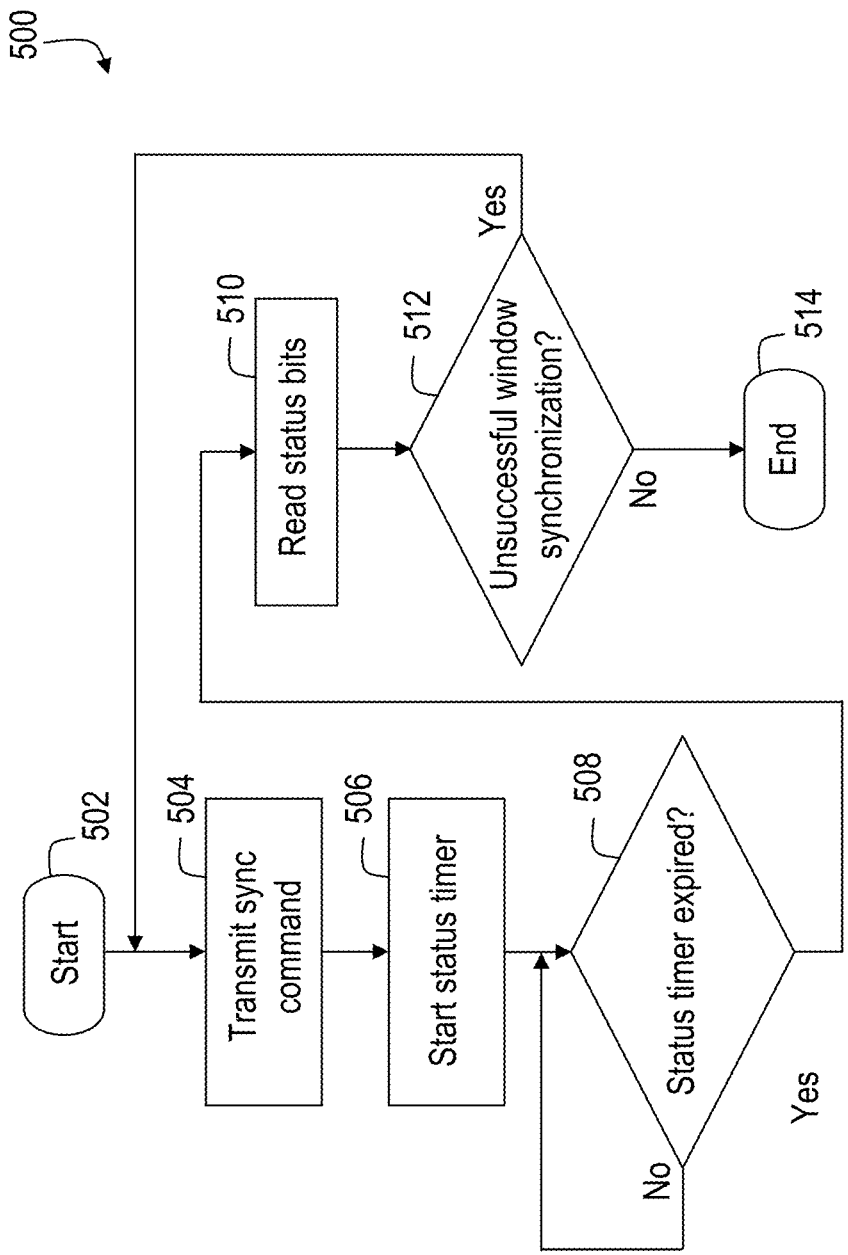
FIG. 5 is a flowchart of an exemplary process implemented by power management code configured according to one aspect of the present disclosure.

With reference to FIG. 5, a flowchart of an exemplary process 500, implemented by power management code 101 according to an embodiment of the present disclosure, is illustrated. In block 502 process 500 is initiated, at which point control transfers to block 504. In block 504, power management code 101 (executing on, for example, one of cores 102 or a dedicated embedded co-processor within the multi-processor system (not shown)) transmits an N/M synchronization command (N/M_sync) on coherent fabric interconnect 105. Next, in block 506, power management code 101 starts status timer 103. Then, in decision block 508, power management code 101 determines whether status timer 103 has expired. In response to status timer 103 not expiring in block 508, control loops on block 508. In response to status timer 103 expiring in block 508, control transfers to block 510.

In block 510, power management code 101 reads status bit 107 of each MC 106 to which an N/M_sync command was directed. Next, in decision block 512, power management code 101 determines whether the N/M_sync command was successful based on status bit 107. In response to an unsuccessful window synchronization, control transfers to block 504, where power management code 101 causes the N/M_sync command to be re-transmitted. In response to a successful window synchronization, control transfers from block 512 to block 514, where process 500 terminates until a new window synchronization is initiated. For example, a new window synchronization may be periodically initiated by power management code 101 or may be initiated by power management code 101 in response to an event (e.g., less than a desired number of requests being issued by MCs 106/108 of an interleave group during a predetermined time period).

Figure 6:
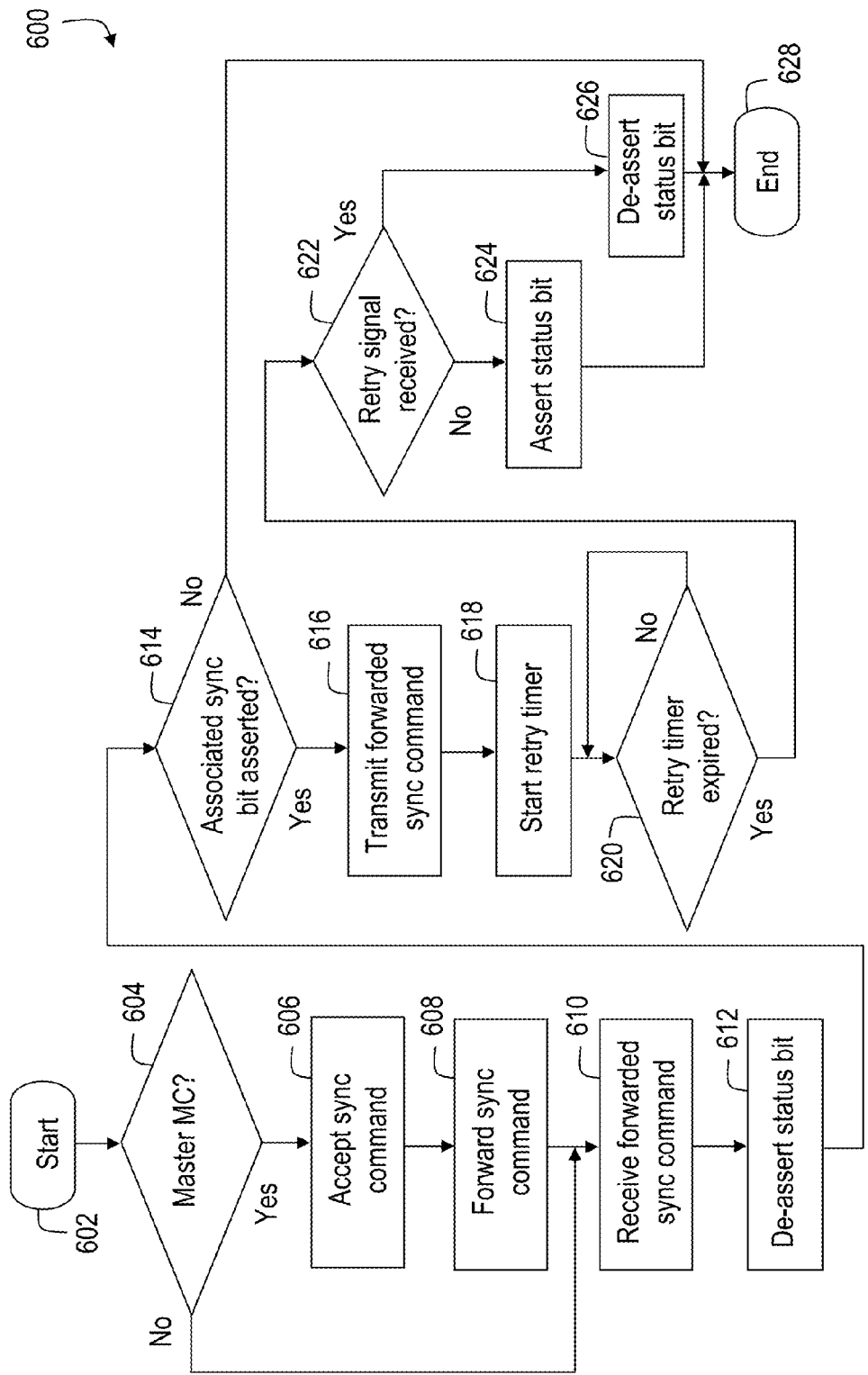
FIG. 6 is a flowchart of an exemplary process employed by a memory controller configured according to another aspect of the present disclosure.

With reference to FIG. 6, a flowchart of an exemplary process 600, implemented by each MC 106 according to an embodiment of the present disclosure, is illustrated. In block 602 process 600 is initiated, at which point control transfers to decision block 604. In block 604, MC 106 determines whether it has been designated to act as the master MC. For example, each MC 106 may access a configuration file at boot-up to determine if it is to act as the master MC. It should be appreciated that not all MCs 106 that are implemented in chip 100 may be active (e.g., to save power) at any given point in time. As such, a given MC 106 that acts as the master MC may change over time. In response to an MC 106 not being selected to act as the master MC, control transfers from block 604 to block 610. In response to an MC 106 being selected to act as the master MC, control transfers from block 604 to block 606. In block 606, the master MC accepts a received N/M_sync command. Next, in block 608, the master MC forwards the received sync command over serial interface 112 to all MCs 106.

Then, in block 610, MC 106 receives the forwarded sync command. Next, in block 612, MC 106 de-asserts status bit 107. Then, in decision block 614, MC 106 determines whether an associated sync bit is asserted in the command data of the sync command. In response to the sync bit for the MC 106 not being asserted in block 614, control transfers to block 628, where process 600 terminates. In response to the sync bit for the MC 106 being asserted in block 614, control transfers to block 616. In block 616, MC 106 transmits the forwarded sync command to power control logic 109. Next, in block 618, MC 106 starts a retry timer 113. Then, in decision block 620, MC 106 determines whether retry timer 113 has expired. In response to retry timer 113 not expiring in block 620, control loops on block 620.

In response to retry timer 113 expiring in block 620, control transfers to decision block 622, where MC 106 determines whether a retry signal has been received (from power control logic 109). In response to a retry signal not being received before expiration of retry timer 113, control transfers to block 624 where MC 106 asserts status bit 107 to provide an indication (for power management code 101) that the window synchronization was successful. In response to a retry signal being received before expiration of retry timer 113, control transfers to block 626, where MC 106 de-asserts status bit 107 to provide an indication that the window synchronization was unsuccessful. Following blocks 624 and 626 control transfers to block 628 where process 600 terminates.

Figure 7:
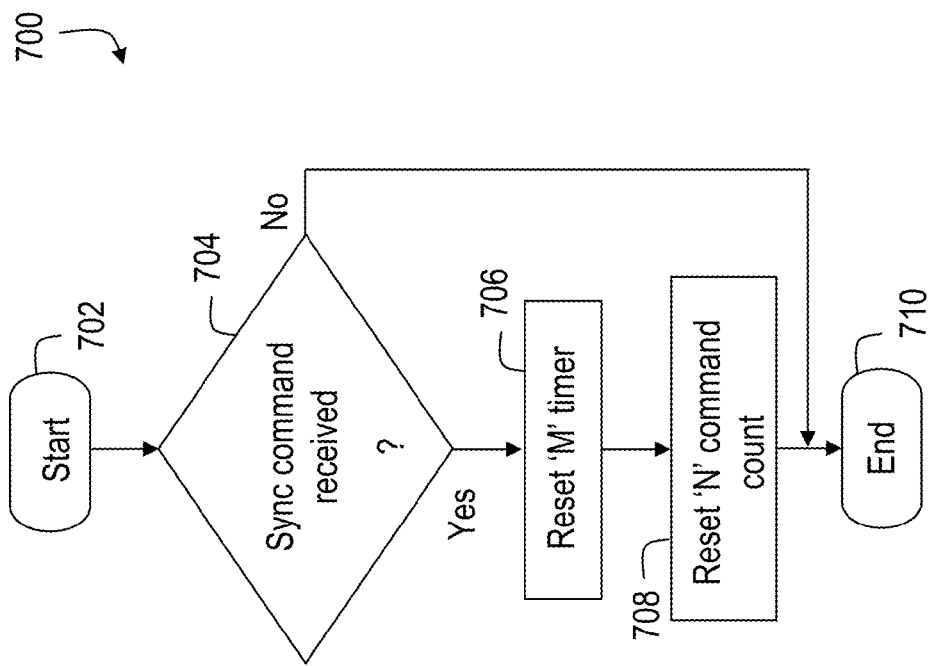
FIG. 7 is a flowchart of an exemplary process implemented by power control logic configured according to a different aspect of the present disclosure.

With reference to FIG. 7, a flowchart of an exemplary process 700, implemented by power control logic 109 according to an embodiment of the present disclosure, is illustrated. In block 702 process 700 is initiated, at which point control transfers to decision block 704. In block 704, power control logic 109 determines whether a sync command has been received. In response to not receiving a sync command in block 704, control transfers to block 710 where process 700 ends. In response to receiving a sync command in block 704, control transfers to block 706 where power control logic 109 resets the 'M' timer, which causes a new window to be started. Next, in block 708, power control logic 109 resets the 'N' the command count to a desired value (set by power management code 101). From block 708, control transfers to block 710.

Figure 8:
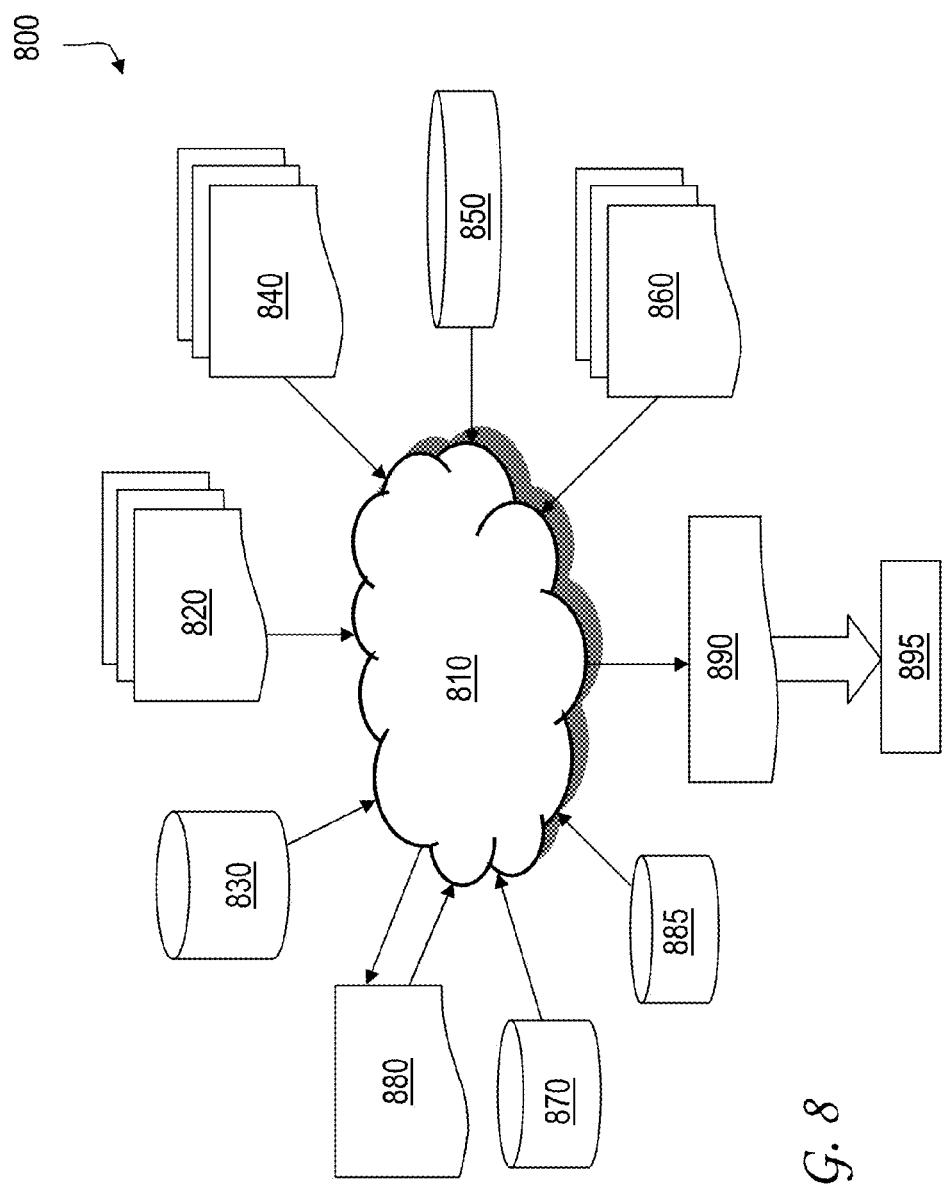
FIG. 8 is a flow diagram of a design process used in semiconductor design, manufacture, and/or test.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in FIGS. 2 and 3. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1 and 2. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1 and 2 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 890 may comprise a compiled, executable HDL simulation model that functionally simulates the devices shown in FIGS. 1 and 2.

Design structure 890 may also employ a data format used for the exchange of layout data of integrated circuits and/or symbolic data format (e.g., information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 and 3. Design structure 890 may then proceed to a stage 895 where, for example, design structure 890: proceeds to tape-out, is released to manufacturing, is released to a mask house, is sent to another design house, is sent back to the customer, etc.

Accordingly, synchronization techniques have been disclosed herein that can be advantageously utilized in conjunction with N/M power control to reduce memory power consumption. It should be appreciated that the disclosed synchronization techniques can also be used for synchronization of other periodic timers (e.g., refresh timers or memory interface periodic calibration timers) by adding additional bits to the command data of an N/M sync command. It is also contemplated that the disclosed synchronization techniques can be used with other power throttling approaches.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," (and similar terms, such as includes, including, has, having, etc.) are open-ended when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method for memory command throttling in a partitioned memory subsystem, comprising:
accepting, by a master memory controller included in multiple memory controllers, a synchronization command, wherein the synchronization command includes command data that includes an associated synchronization indication for each of the multiple memory controllers, and wherein each of the multiple memory controllers controls a respective partition of the partitioned memory subsystem;

in response to receiving the synchronization command, forwarding, by the master memory controller, the synchronization command to the multiple memory controllers;

in response to receiving the forwarded synchronization command, de-asserting, by each of the multiple memory controllers, an associated status bit;

in response to receiving the forwarded synchronization command, determining, by each of the multiple memory controllers, whether the associated synchronization indication is asserted; and transmitting, from each of the multiple memory controllers with the asserted associated synchronization indication, the forwarded synchronization command to associated power control logic.

2. The method of claim 1, further comprising:

starting, by each of the multiple memory controllers that is transmitting the forwarded synchronization command, an associated retry timer.

3. The method of claim 2, further comprising:

in response to the retry timer expiring before a retry signal is received, asserting, by each of the multiple memory controllers that transmitted the forwarded synchronization command, the associated status bit to indicate a successful window synchronization.

4. The method of claim 2, further comprising:

in response to the retry timer not expiring before a retry signal is received, de-asserting, by each of the multiple memory controllers that transmitted the forwarded synchronization command, the associated status bit to indicate an unsuccessful window synchronization.

5. The method of claim 1, further comprising:

issuing, from a processor of a multi-processor system that is executing power management code, the synchronization command; and in response to issuing the synchronization command, starting, by the processor, a status timer.

6. The method of claim 5, further comprising:

in response to the status timer expiring, reading, by the processor, the associated status bit for each of the multiple memory controllers that transmitted the forwarded synchronization command;

determining, by the processor, whether the read associated status bit for each of the multiple memory controllers that transmitted the forwarded synchronization command indicates an unsuccessful window synchronization; and in response to determining, by the processor, the window synchronization was unsuccessful, re-issuing, from the processor, the synchronization command.

7. The method of claim 1, wherein the master memory controller is selected at boot-up based on contents of a configuration file.

* * * * *